United States Patent
Ando et al.

(10) Patent No.: US 10,879,308 B1
(45) Date of Patent: Dec. 29, 2020

(54) STACKED NANOSHEET 4T2R UNIT CELL FOR NEUROMORPHIC COMPUTING

(71) Applicant: International Business Machines Corporation, Armonk, NY (US)

(72) Inventors: Takashi Ando, Eastchester, NY (US); Bahman Hekmatshoartabari, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/576,551

(22) Filed: Sep. 19, 2019

(51) Int. Cl.
*H01L 27/24* (2006.01)
*H01L 21/02* (2006.01)
(Continued)

(52) U.S. Cl.
CPC ......... *H01L 27/2436* (2013.01); *G06N 3/061* (2013.01); *G06N 3/063* (2013.01); *G11C 13/004* (2013.01); *G11C 13/0007* (2013.01); *H01L 21/02532* (2013.01); *H01L 21/28079* (2013.01); *H01L 27/249* (2013.01); *H01L 27/2481* (2013.01); *H01L 29/0673* (2013.01); *H01L 29/0847* (2013.01); *H01L 29/1037* (2013.01); *H01L 29/42392* (2013.01); *H01L 29/66545* (2013.01); *H01L 29/66795* (2013.01); *H01L 29/785* (2013.01); *H01L 45/1233* (2013.01); *H01L 45/1253* (2013.01); *H01L 45/146* (2013.01); *H01L 45/1683* (2013.01); *G11C 2213/32* (2013.01); *G11C 2213/52* (2013.01); *G11C 2213/71* (2013.01); *G11C 2213/74* (2013.01); *G11C 2213/79* (2013.01)

(58) Field of Classification Search
CPC combination set(s) only.
See application file for complete search history.

(56) References Cited

U.S. PATENT DOCUMENTS 9,076,523 B2   7/2015  Lee et al.
9,178,000 B1   11/2015 Nardi et al.
(Continued)

OTHER PUBLICATIONS

Electronic Materials Research Laboratory (EMRL), "Integration of TiO2 into Nano-Crossbar Arrays with 100 nm Half Pitch for Resistive RAM Applications," accessed Sep. 19, 2019 (7 pages).
(Continued)

*Primary Examiner* — Mushfique Siddique
(74) *Attorney, Agent, or Firm* — Randall Bluestone; Michael J. Chang, LLC

(57) ABSTRACT

A nanosheet 4T2R unit cell for neuromorphic computing is provided. In one aspect, a method of forming a 4T2R unit cell includes: forming nanosheets on a substrate having alternating sacrificial and channel nanosheets; patterning the nanosheets into FET stacks; forming lower/upper source and drains on opposite sides of lower/upper portions of the FET stacks; forming a first gate of an FET1 in the upper portion of a first FET stack, a second gate of an FET2 in the upper portion of a second FET stack, a third gate of an FET3 in the lower portion of a second FET stack, and a fourth gate of an FET4 in the lower portion of a third FET stack; and forming RRAM devices in contact vias to the source and drains of the FET1 and the FET4. A 4T2R unit cell and method for neuromorphic computing are also provided.

20 Claims, 18 Drawing Sheets

(51) Int. Cl.

| | |
|---|---|
| *H01L 29/10* | (2006.01) |
| *H01L 29/08* | (2006.01) |
| *H01L 29/423* | (2006.01) |
| *H01L 45/00* | (2006.01) |
| *H01L 29/66* | (2006.01) |
| *H01L 21/28* | (2006.01) |
| *H01L 29/78* | (2006.01) |
| *G11C 13/00* | (2006.01) |
| *G06N 3/063* | (2006.01) |
| *H01L 29/06* | (2006.01) |
| *G06N 3/06* | (2006.01) |

(56) References Cited

U.S. PATENT DOCUMENTS

| | | |
|---|---|---|
| 9,224,811 B2 | 12/2015 | Cheng et al. |
| 9,230,649 B2 | 1/2016 | Chang et al. |
| 9,812,205 B2 | 11/2017 | Ghosh et al. |
| 10,127,494 B1 | 11/2018 | Cantin et al. |
| 10,297,749 B1 | 5/2019 | Hashemi et al. |
| 10,504,963 B2 * | 12/2019 | Yang ................ H01L 45/08 |
| 10,734,447 B2 * | 8/2020 | Ando ................ H01L 27/249 |
| 2018/0005110 A1 | 1/2018 | Gokmen et al. |
| 2019/0131394 A1 | 5/2019 | Reznicek et al. |
| 2019/0244666 A1 * | 8/2019 | Hsu ................ G11C 14/009 |
| 2020/0134416 A1 * | 4/2020 | Niggemeyer ......... G06F 1/3206 |

OTHER PUBLICATIONS

Gokmen et al., "Acceleration of Deep Neural Network Training with Resistive Cross-Point Devices: Design Considerations," Frontiers in Neuroscience, vol. 10, article 333 (Jul. 2016) (13 pages).

Burr et al., "Experimental Demonstration and Tolerancing of a Large-Scale Neural Network (165 000 Synapses) Using Phase-Change Memory as the Synaptic Weight Element," IEEE Transactions on Electron Devices, vol. 62, No. 11, pp. 3498-3507 (Nov. 2015).

Chang et al, "A ReRAM-based 4T2R Nonvolatile TCAM Using RC-Filtered Stress-Decoupled Scheme for Frequent-Off Instant-On Search Engines Used in IoT and Big-Data Processing," IEEE Journal of Solid-State Circuits, vol. 51, No. 11, Nov. 2016, pp. 2786-2798.

* cited by examiner

US 10,879,308 B1

STACKED NANOSHEET 4T2R UNIT CELL FOR NEUROMORPHIC COMPUTING

FIELD OF THE INVENTION

The present invention relates to neuromorphic computing, and more particularly, to a stacked nanosheet four transistor two resistive random access memory (RRAM), i.e., 4T2R, unit cell for neuromorphic computing.

BACKGROUND OF THE INVENTION

Resistive random access memory (RRAM) cells store information based on a resistance across a dielectric element. The dielectric is typically insulating. However, an applied voltage to the RRAM cell can be used to form an electrically-conductive path or filament through the dielectric element. During a RESET operation, the filament is broken/ruptured thereby increasing the cell resistance. During a SET operation, an applied voltage can again be used to re-form the filament and decrease the cell resistance.

RRAM is considered a promising technology for electronic synapse devices or memristors for neuromorphic computing, as well as high-density and high-speed, non-volatile memory applications. In neuromorphic computing applications, a resistive memory device can be used as a connection (i.e., a synapse) between a pre-neuron and post-neuron, representing the connection weight in the form of device resistance. Multiple pre-neurons and post-neurons can be connected through a crossbar array of RRAMs, which naturally expresses a fully-connected neural network.

For neural network training (weight update), one ideally needs either: one bipolar RRAM with symmetric switching, or two unipolar RRAMs (2R) with linear switching for differential weight. Unfortunately, the ideal memory with symmetric switching does not currently exist. Thus, a 2R design is needed. Doing so, however, requires more devices and periphery circuits to represent one weight and comes with an area penalty.

Thus, simplified RRAM unit cell designs for differential reading having a reduced footprint would be desirable.

SUMMARY OF THE INVENTION

The present invention provides stacked nanosheet four field-effect transistor (FET) two resistive random access memory (RRAM) unit cell for neuromorphic computing. In one aspect of the invention, a method of forming a four FET two RRAM unit cell is provided. The method includes: forming nanosheets on a substrate having alternating sacrificial and channel nanosheets; patterning the nanosheets into FET stacks such that each of the FET stacks has portions of the sacrificial and channel nanosheets, wherein the FET stacks include at least a first FET stack, a second FET stack and a third FET stack; forming lower source and drains on opposite sides of the channel nanosheets in a lower portion of the FET stacks; forming upper source and drains on opposite sides of the channel nanosheets in an upper portion of the FET stacks, wherein the upper source and drains are separated from the lower source and drains by an isolation spacer; selectively removing the sacrificial nanosheets from the first FET stack; forming i) a first gate of a first FET (FET1) that surrounds at least a portion of the channel nanosheets in the upper portion of the first FET stack; selectively removing the sacrificial nanosheets from the second FET stack and the third FET stack; forming ii) a second gate of a second FET (FET2) that surrounds at least a portion of the channel nanosheets in the upper portion of the second FET stack, iii) a third gate of a third FET (FET3) that surrounds at least a portion of the channel nanosheets in the lower portion of the second FET stack, and iv) a fourth gate of a fourth FET (FET4) that surrounds at least a portion of the channel nanosheets in the lower portion of the third FET stack; and forming RRAM devices in contact vias to the source and drains of the FET1 and the FET4.

In another aspect of the invention, a four FET two RRAM unit cell is provided. The four FET two RRAM unit cell includes: FET stacks of channel nanosheets disposed on a substrate, the FET stacks including at least a first FET stack, a second FET stack and a third FET stack; lower source and drains formed on opposite sides of the channel nanosheets in a lower portion of the FET stacks; upper source and drains formed on opposite sides of the channel nanosheets in an upper portion of the FET stacks, wherein the upper source and drains are separated from the lower source and drains by an isolation spacer; a first gate of a first FET (FET1) that surrounds at least a portion of the channel nanosheets in the upper portion of the first FET stack; a second gate of a second FET (FET2) that surrounds at least a portion of the channel nanosheets in the upper portion of the second FET stack; a third gate of a third FET (FET3) that surrounds at least a portion of the channel nanosheets in the lower portion of the second FET stack; a fourth gate of a fourth FET (FET4) that surrounds at least a portion of the channel nanosheets in the lower portion of the third FET stack; and RRAM devices formed in contact vias to the source and drains of the FET1 and the FET4.

In yet another aspect of the invention, a method for neuromorphic computing is provided. The method includes: providing a four FET two RRAM unit cell, having: FET stacks of channel nanosheets disposed on a substrate, the FET stacks including at least a first FET stack, a second FET stack and a third FET stack; lower source and drains formed on opposite sides of the channel nanosheets in a lower portion of the FET stacks; upper source and drains formed on opposite sides of the channel nanosheets in an upper portion of the FET stacks, wherein the upper source and drains are separated from the lower source and drains by an isolation spacer; a first gate of a first FET (FET1) that surrounds at least a portion of the channel nanosheets in the upper portion of the first FET stack; a second gate of a second FET (FET2) that surrounds at least a portion of the channel nanosheets in the upper portion of the second FET stack; a third gate of a third FET (FET3) that surrounds at least a portion of the channel nanosheets in the lower portion of the second FET stack; a fourth gate of a fourth FET (FET4) that surrounds at least a portion of the channel nanosheets in the lower portion of the third FET stack; an RRAM1 formed in a contact via to the source and drains of the FET1, and an RRAM2 formed in a contact via to the source and drains of the FET4; applying alternating positive and negative pulses to the RRAM1 until a resistance R+ of RRAM1 settles to a symmetric switching point; adjusting a resistance R− of RRAM2 to the symmetric switching point; and updating the resistance R+ of RRAM1 using the resistance R− of RRAM2 as a fixed reference at the symmetric switching point.

A more complete understanding of the present invention, as well as further features and advantages of the present invention, will be obtained by reference to the following detailed description and drawings.

DETAILED DESCRIPTION OF PREFERRED EMBODIMENTS

Figure 1:
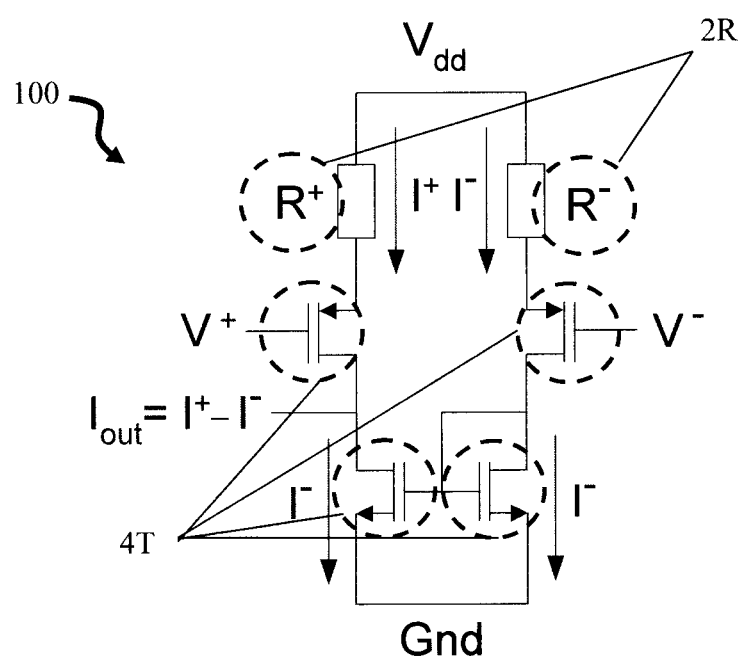
FIG. 1 is a circuit diagram of exemplary mirror circuit for differential weight during neural network training according to an embodiment of the present invention.

As provided above, since an ideal memory with symmetric switching does not currently exist, two unipolar resistive random access memory (RRAM) (2R) with linear switching are needed for differential weight during neural network training. For instance, a mirror circuit can be used for differential read of two resistive memory devices, i.e., $R^+$ and $R^-$, to represent one weight. See, for example, mirror circuit 100 of FIG. 1. As shown in FIG. 1, the unit cell for mirror circuit 100 is four transistors (4T) two RRAM (2R), i.e., 4T2R. However, implementing mirror circuit 100 with conventional field-effect transistor (FET) and RRAM devices comes with a significant area penalty.

Advantageously, provided herein are techniques for using three adjacent stacked nanosheet FETs (i.e., left, middle and right FETs) and RRAM devices in the source and drain contact vias to constitute a 4T2R unit cell for a mirror circuit. Namely, as will be described in detail below, the lower and upper nanosheets in the middle FET stack are isolated with a shared metal gate. The RRAM devices are formed in the contact vias to the source and drains of the left and right FETs.

As such, acceleration of neural network training becomes possible using existing stacked nanosheet FET and RRAM (non-symmetric) technologies with a tightly scaled 4T2R configuration to represent one synaptic weight. Advantageously, the present 4T2R unit cell design occupies a footprint corresponding to only three adjacent nanosheet FETs.

Figure 2:
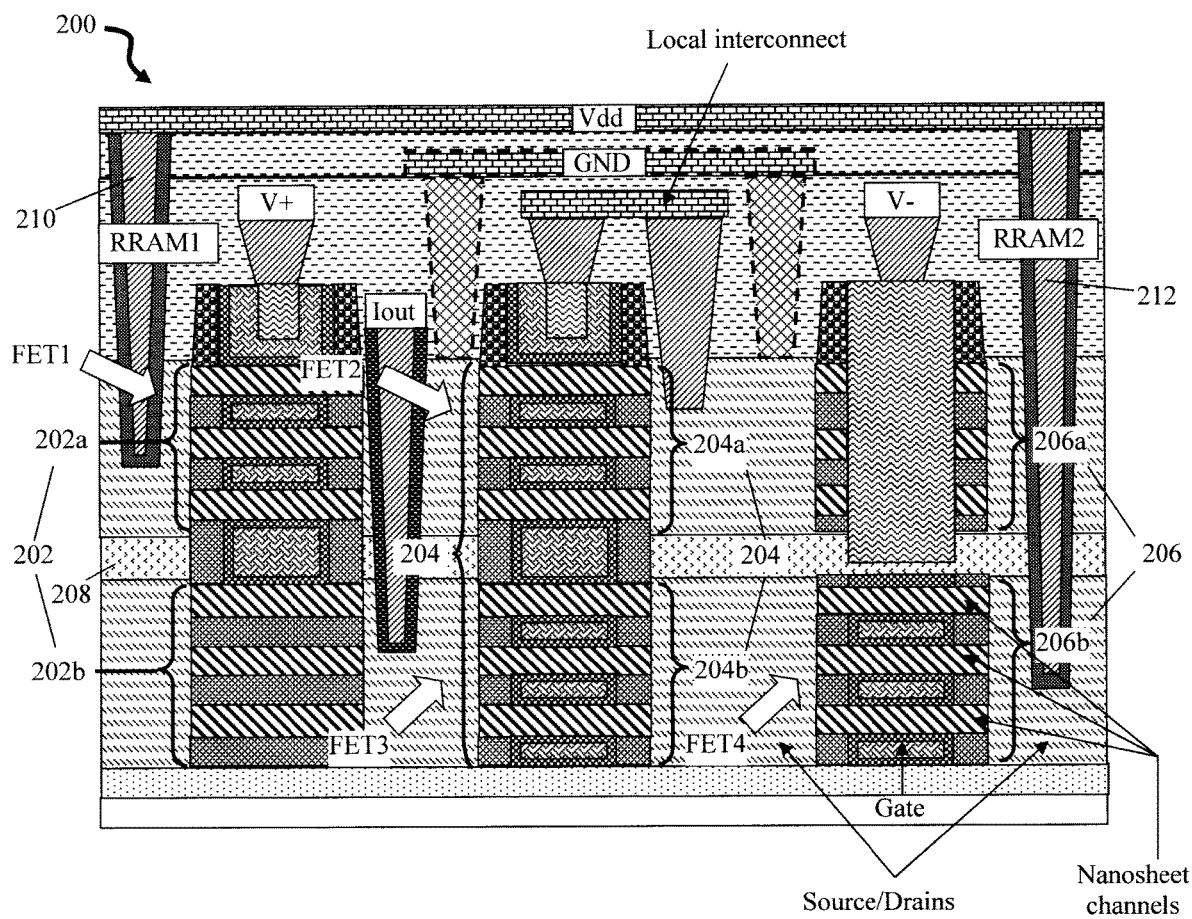
FIG. 2 is a cross-sectional diagram illustrating an exemplary nanosheet 4T2R unit cell according to an embodiment of the present invention.

FIG. 2 is a cross-sectional diagram illustrating an exemplary stacked nanosheet 4T2R unit cell 200 in accordance with the present techniques. As shown in FIG. 2, 4T2R unit cell 200 includes three adjacent nanosheet FET stacks, i.e., (left) nanosheet FET stack 202, (middle) nanosheet FET stack 204, and (right) nanosheet FET stack 206. A top 202a/204a/206a and a bottom 202b/204b/206b of each stack is separated by a dielectric 208.

As shown in FIG. 2, the four transistors of unit cell 200 include FET1 formed in the top 202a of the left stack 202, FET2 and FET3 formed in the top 204a and bottom 204b of the middle stack 204, and FET4 formed in the bottom 206b of the right stack 206. As highlighted above, FET2 and FET3 of the middle stack 204 are isolated with a shared metal gate.

Namely, each nanosheet FETs includes source and drains interconnected by nanosheet channels. A gate surrounds at least a portion of each of the nanosheet channels. For instance, using FET4 as an example, (epitaxial) 'Source/Drains' are disposed on opposite sides of the stack of 'Nanosheet channels'. As will be described in detail below, the process for fabricating the nanosheet FETs involves selectively removing sacrificial nanosheets from the stack which enables the 'Gate' to surround a portion of each of the nanosheet channels in a gate-all-around (GAA) configuration. Although not individually labeled, FET1, FET2, and FET3 are each configured the same as FET4.

As highlighted above, the RRAM devices of 4T2R unit cell 200 are formed in the contact vias to the source and drains of the left and right FETs. Specifically, as shown in FIG. 2 the two RRAM devices of unit cell 200 include RRAM1 formed in the contact via 210 to the source and drains of FET1, and RRAM2 formed in the contact via 212 to the source and drains of FET4.

Figure 3:
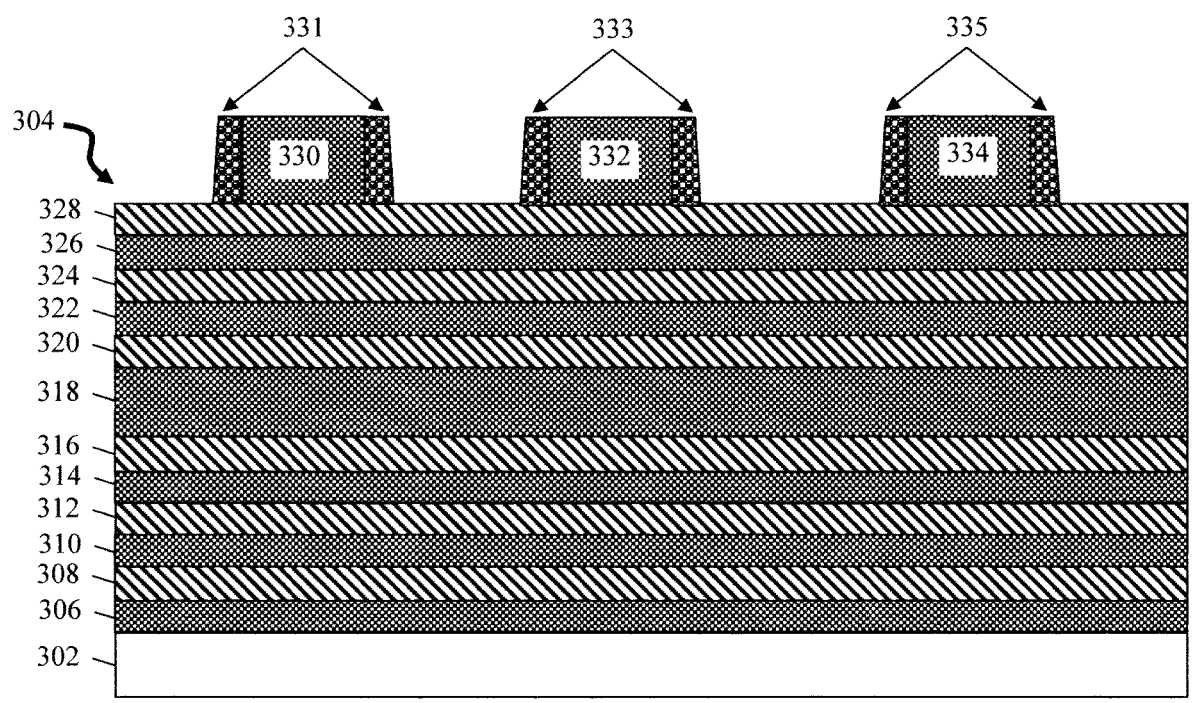
FIG. 3 is a cross-sectional diagram illustrating an alternating stack of sacrificial and channel nanosheets having been formed on a substrate, and sacrificial gates and gate spacers having been formed on the stack marking the footprint and location of individual field effect transistor (FET) nanosheet stacks according to an embodiment of the present invention.

An exemplary methodology for forming a 4T2R unit cell such as 4T2R unit cell 200 is now described by way of reference to FIGS. 3-17. As shown in FIG. 3, the process begins with a substrate 302. According to an exemplary embodiment, semiconductor substrate 302 is a bulk semiconductor wafer formed from silicon (Si), strained Si, silicon carbide (SiC), germanium (Ge), silicon germanium (SiGe), silicon-germanium-carbon (SiGeC), Si alloys, Ge alloys, gallium arsenide (GaAs), indium arsenide (InAs), indium phosphide (InP), or any combination thereof.

A stack 304 of nanosheets is then formed on substrate 302. According to an exemplary embodiment, this process involves forming (e.g., growing) alternating sacrificial and channel nanosheets in a stack on the wafer. For instance, in the present example, alternating SiGe (sacrificial) and Si (channel) nanosheets are formed in a stack on the wafer. The term sacrificial, as used herein, refers to a nanosheet that is (in whole or in part) removed before completion of the final device. For instance, in the instant example, portions of the sacrificial SiGe nanosheets will be selectively removed from the stack in the channel region of the device to permit the Si channel nanosheets to be released from the stack. It is notable that SiGe and Si are being used as illustrative, non-limiting examples of sacrificial and channel materials, respectively. It is to be understood that any combination of sacrificial and channel materials may be employed in accordance with the present techniques. For instance, one might instead employ selective etching technology which permits Si to be used as the sacrificial material between SiGe channel nanosheets.

The building of stack 304 begins with the formation of a sacrificial nanosheet, i.e., SiGe nanosheet 306, on substrate 302. According to an exemplary embodiment, each of the nanosheets in stack 304 are formed using an epitaxial growth process. In that case, SiGe nanosheet 306 is formed from epitaxial SiGe. In one exemplary embodiment, each of the sacrificial and channel nanosheets in stack 304 (other than the sacrificial nanosheet at the center of stack 304 —see below) have a thickness of from about 5 nm to about 25 nm, and ranges therebetween.

To continue building the stack 304, an Si channel nanosheet 308 is next formed on the sacrificial SiGe nanosheet 306. As provided above, the nanosheets in stack 304 can be formed using an epitaxial growth process to a thickness, e.g., of from about 5 nm to about 25 nm, and ranges therebetween. In that case, Si nanosheet 308 is formed from epitaxial Si. The process is then repeated to add alternating sacrificial SiGe nanosheets 310, 314, 318, 322, 326, etc. and channel Si nanosheets 312, 316, 320, 324, 328, etc. to the stack 304. Each of these additional layers of stack 304 can be formed in the same manner as described above, e.g., using an epitaxial growth process, to a thickness, e.g., of from about 5 nm to about 25 nm, and ranges therebetween. It is notable that the number of sacrificial and channel nanosheets formed can vary from what is depicted in the figures. For instance, embodiments are contemplated herein where stack 304 contains more or fewer sacrificial and channel nanosheets than shown.

The only variant in the stack 304 might be the thickness of sacrificial SiGe layer 318. As highlighted above, the upper and lower nanosheets in the stack 304 will be used to form the various FETs of the unit cell. Sacrificial SiGe layer 318 is present between these upper and lower nanosheets. For instance, the upper nanosheets are those nanosheets above sacrificial SiGe layer 318, and the lower nanosheets are those nanosheets below sacrificial SiGe layer 318. Thus, to provide spatial separation between the upper and lower nanosheets, it may be desirable to employ a thicker sacrificial SiGe layer 318, i.e., having a thickness of from about 20 nm to about 35 nm, and ranges therebetween.

As highlighted above, the present 4T2R unit cell design includes three adjacent nanosheet FET stacks which will be patterned from stack 304. To do so, sacrificial gates 330, 332 and 334 and sacrificial gate spacers 331, 333 and 335 are then formed on the stack 304 marking the footprint and location of the FET stacks. See FIG. 3. According to an exemplary embodiment, sacrificial gates 330, 332 and 334 are formed by first depositing a suitable sacrificial gate material, and then using lithography and etching techniques to pattern the sacrificial gate material into the individual sacrificial gates 330, 332 and 334. Suitable sacrificial gate materials include, but are not limited to, poly-silicon and/or amorphous silicon. A suitable spacer material is then deposited onto the sacrificial gates 330, 332 and 334. Lithography and etching techniques are then used to pattern the spacer material into the individual sacrificial gate spacers 331, 333 and 335. Suitable spacer materials include, but are not limited to, oxide spacer materials such as silicon oxide (SiOx) and/or nitride spacer materials such as silicon nitride (SiN).

Figure 4:
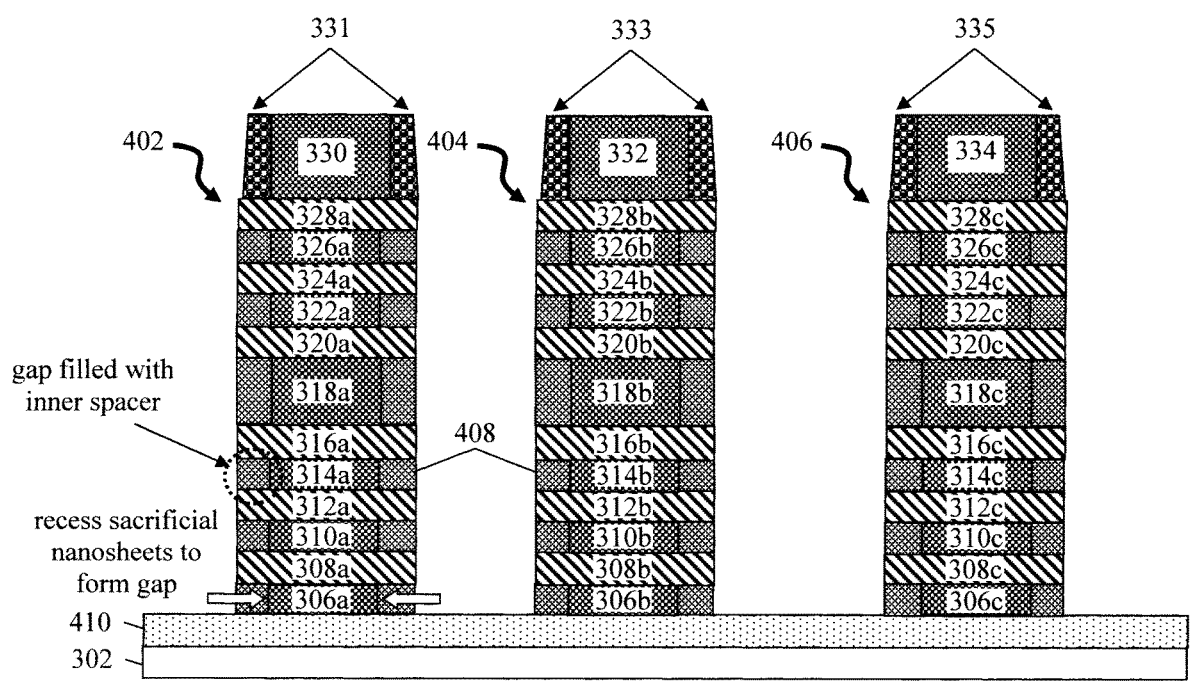
FIG. 4 is a cross-sectional diagram illustrating the stack having been patterned into the individual FET stacks beneath the sacrificial gate/sacrificial gate spacers, patterned portions of the sacrificial nanosheets in each of the FET stacks having been recessed to form a gap between each vertically adjacent channel nanosheet, inner spacers having been formed in the gaps, and an isolation layer having been formed between the FET stacks and the substrate according to an embodiment of the present invention.
Figure 5:
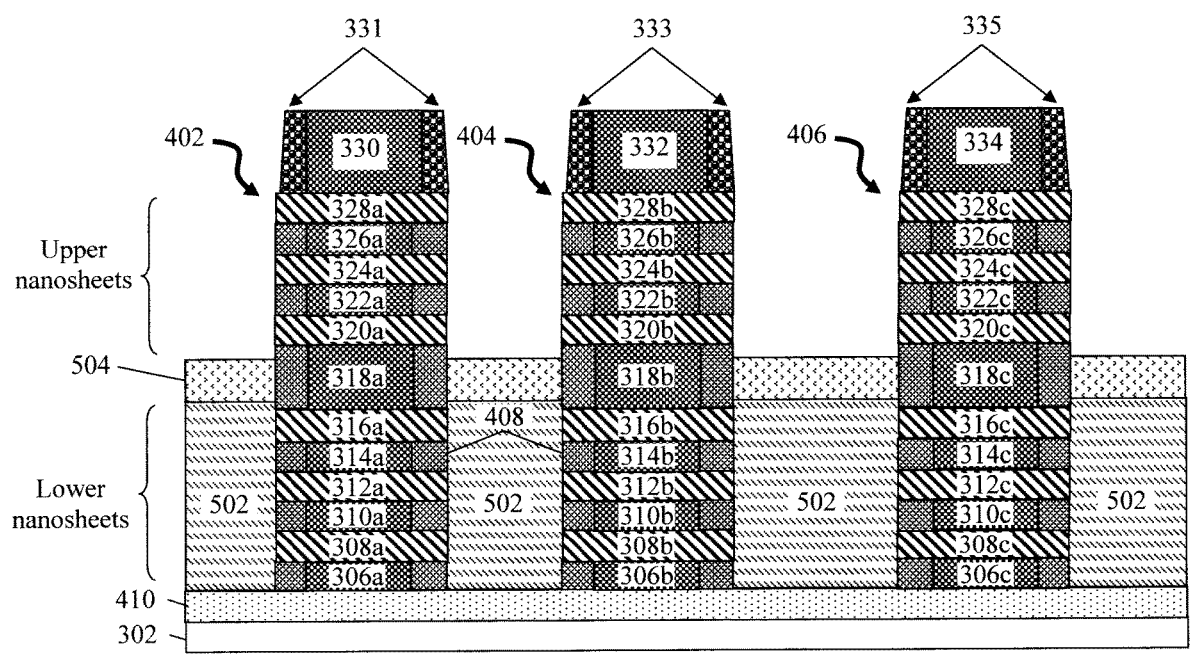
FIG. 5 is a cross-sectional diagram illustrating lower source and drains having been formed on opposite sides of the lower channel nanosheets, and an isolation spacer having been formed on the lower source and drains according to an embodiment of the present invention.
Figure 6:
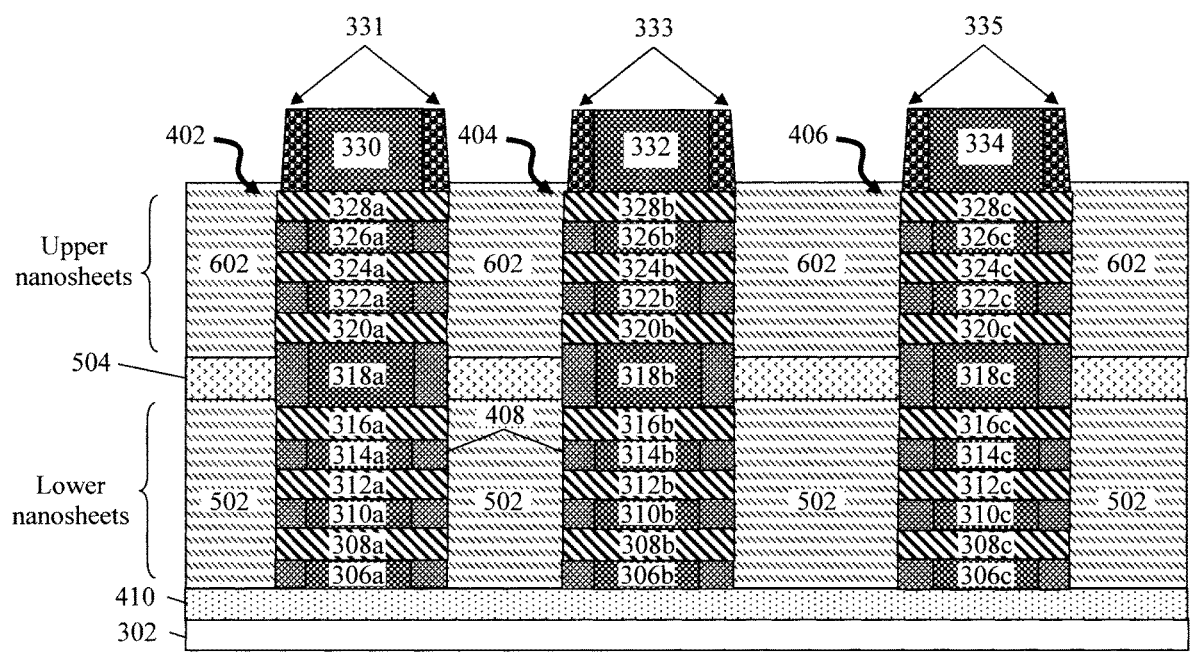
FIG. 6 is a cross-sectional diagram illustrating upper source and drains having been formed on opposite sides of the upper channel nanosheets according to an embodiment of the present invention.

A directional (anisotropic) etching process such as reactive ion etching (RIE) is then used to pattern stack 304 into individual FET stacks 402, 404 and 406 beneath sacrificial gate/sacrificial gate spacers 330/331, 332/333 and 334/335, respectively. See FIG. 4. For clarity, terms 'first,' 'second,' and 'third' may also be used herein when referring to FET stacks 402, 404 and 406, respectively. As shown in FIG. 4, each FET stack 402, 404 and 406 includes a patterned portion of sacrificial SiGe nanosheets 306, 310, 314, 318, 322, 326, etc. and channel Si nanosheets 308, 312, 316, 320, 324, 328, etc. which are given the reference numeral designations 'a', 'b', and 'c', respectively.

As shown in FIG. 4, the patterned portion of sacrificial SiGe nanosheets 306a,b,c, 310a,b,c, 314a,b,c, 318a,b,c, 322a,b,c, 326a,b,c, etc. in each of FET stacks 402, 404 and 406, respectively, is recessed to form a gap between each vertically adjacent channel Si nanosheets 308a,b,c, 312a,b, c, 316a,b,c, 320a,b,c, 324a,b,c, 328a,b,c, etc. According to an exemplary embodiment, this recessing of sacrificial SiGe nanosheets is carried out using a lateral etching process selective for the removal of sacrificial SiGe nanosheets exposed along the FET stacks sidewalls selective to the channel Si nanosheets. For instance, by way of example only, chemical etchants such as ammonium hydroxide (NH$_4$OH), tetraethylammonium hydroxide (TEAH) and/or tetramethylammonium hydroxide (TMAH) can be employed to etch SiGe selective to Si.

As shown in FIG. 4, inner spacers 408 are then formed in the gaps. According to an exemplary embodiment, inner spacers 408 are formed by depositing a suitable spacer material, and then using a directional (anisotropic) etching process such as RIE to clear all but the spacer material deposited into the gaps, forming the individual inner spacers 408 shown in FIG. 4. As provided above, suitable spacer materials include, but are not limited to, oxide spacer materials such as SiOx and/or nitride spacer materials such as SiN.

An isolation layer 410 is then formed between FET stacks 402, 404 and 406 and substrate 302. See FIG. 4. According to an exemplary embodiment, isolation layer 410 is formed by first recessing a top portion of the substrate 302, and then depositing a dielectric material (such as SiOx) over the recessed substrate 302. An etch-back of the dielectric material forms the isolation layer 410. Notably, during this process, sacrificial gates 330, 332 and 334/sacrificial gate spacers 331, 333 and 335 serve to anchor FET stacks 402, 404 and 406, respectively.

Source and drains are then formed on opposite sides of the upper and lower channel nanosheets. Generally, this process involves epitaxially growing the source and drains from the channel Si nanosheets 308a,b,c, 312a,b,c, 316a,b,c, 320a,b,c, 324a,b,c, 328a,b,c, etc. exposed along the sidewalls of FET stacks 402, 404 and 406, respectively. Inner spacers 408 isolate the sacrificial SiGe nanosheets 306a,b,c, 310a,b,c, 314a,b,c, 318a,b,c, 322a,b,c, 326a,b,c, etc., thereby preventing any epitaxial growth to occur from the sacrificial material. Source and drain dopants can be introduced in-situ (i.e., during epitaxy) or ex-situ (e.g., by ion implantation). Thus, to use an illustrative, non-limiting example, in-situ or ex-situ doped Si source and drains are grown from channel Si nanosheets 308a,b,c, 312a,b,c, 316a,b,c, 320a,b,c, 324a,b,c, 328a,b,c, etc. Further, the source and drains of the lower nanosheets are isolated from those of the upper nanosheets by a dielectric. To do so, the source and drains of the lower nanosheets are formed first, followed by deposition of the dielectric, and then formation of the source and drains of the upper nanosheets over the dielectric.

Specifically, an epitaxial growth process is first employed to form source and drains on opposite sides of FET stacks 402, 404 and 406. The source and drains are doped with an n-type or p-type dopant. Suitable n-type dopants include, but are not limited to, phosphorous (P) and/or arsenic (As) and suitable p-type dopants include, but are not limited to, boron (B). Of course, at this stage of the process, the source and drain epitaxial growth will occur along the entire (i.e., both upper and lower) sidewall of each FET stacks 402, 404 and 406. However, this growth is then followed by a recess etch of the source and drain epitaxy to the lower portion of the stack, forming lower source and drains 502 on opposite sides of the lower nanosheets of FET stacks 402, 404 and 406. See FIG. 5.

A dielectric is then deposited onto the lower source and drains 502, and then recessed, forming isolation spacer 504. See FIG. 5. Suitable dielectric materials for isolation spacer 504 include, but are not limited to, SiOx.

The same general process is then repeated to form upper source and drains 602 on opposite sides of the upper portion of FET stacks 402, 404 and 406. See FIG. 6. Upper source and drains 602 are doped with an n-type (e.g., P and/or As) or p-type (e.g., B) dopant. Isolation spacer 504 protects/isolates the lower source and drains 502 during formation of the upper source and drains 602.

Figure 7:
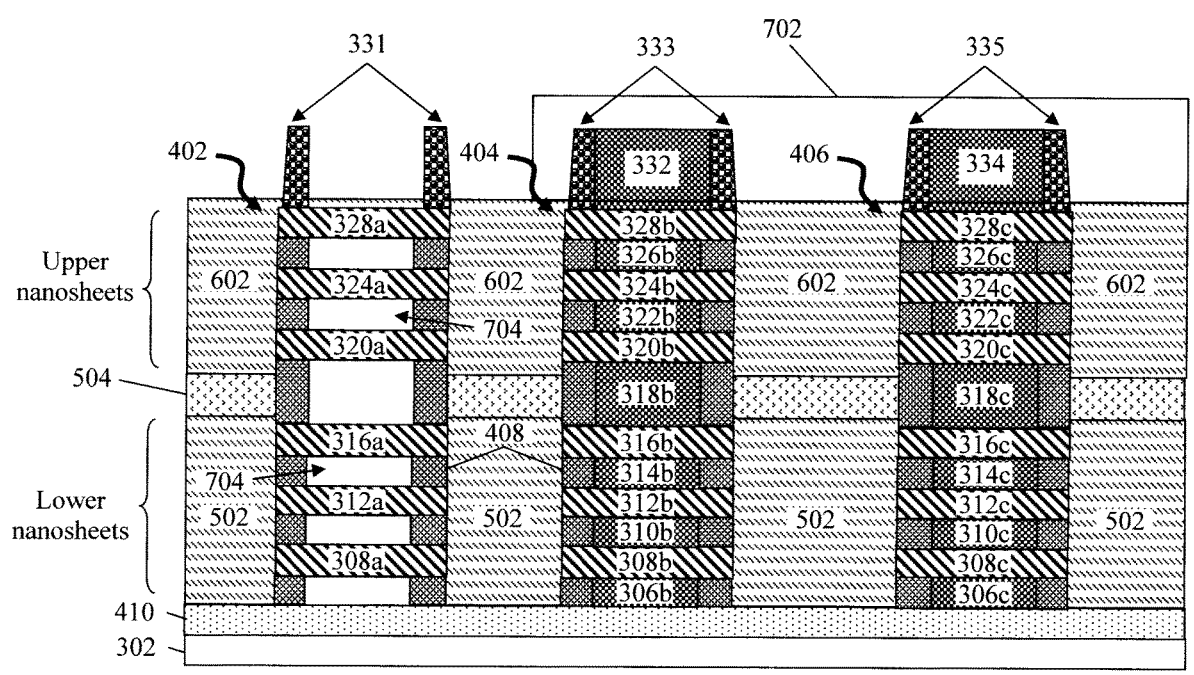
FIG. 7 is a cross-sectional diagram illustrating a patterned hardmask having been formed covering a (middle) FET stack and (right) FET stack, and the sacrificial gate and sacrificial nanosheets having been selectively removed from the (left) FET stack forming cavities in the (left) FET stack according to an embodiment of the present invention.
Figure 8:
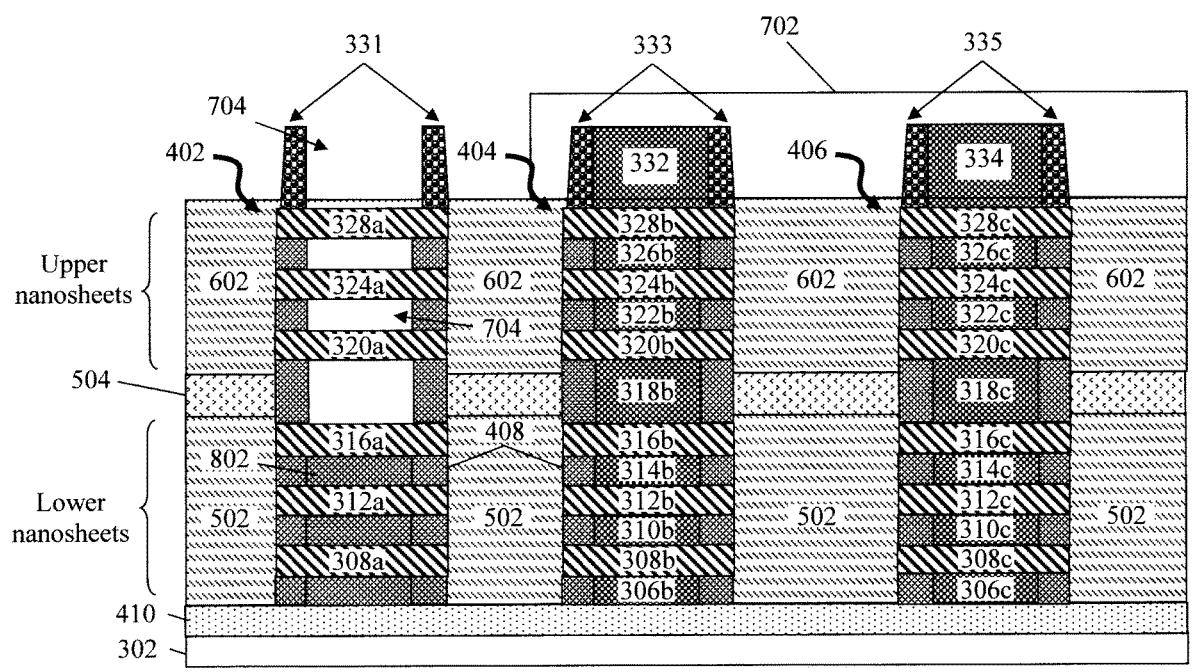
FIG. 8 is a cross-sectional diagram illustrating the cavities in the (left) FET stack having been filled with a dielectric material which is then etched back to a level below the isolation spacer according to an embodiment of the present invention.
Figure 9:
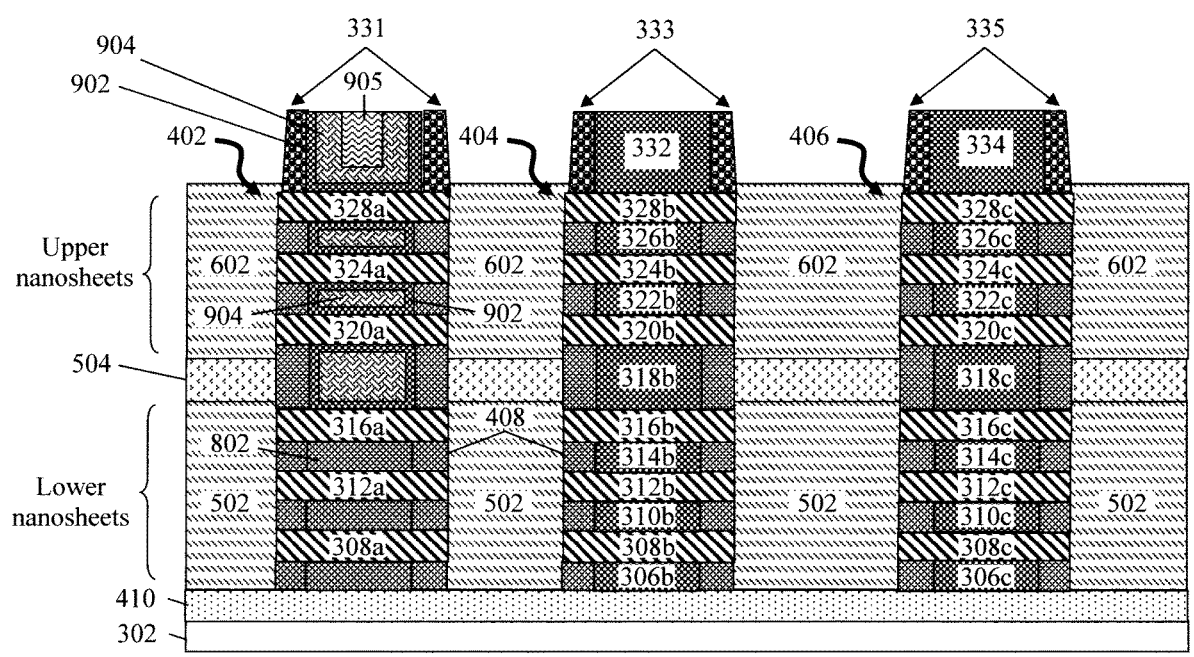
FIG. 9 is a cross-sectional diagram illustrating a (first) replacement metal gate having been formed in the cavities of the upper portion of the (left) FET stack forming a FET1 according to an embodiment of the present invention.

The four transistors of the present 4T2R unit cell include a first FET (FET1) formed in the upper nanosheets of FET stack 402, a second FET (FET2) and a third FET (FET3) formed in the upper and lower nanosheets of FET stack 404, respectively, and a fourth FET formed in the lower nanosheets of FET stack 406. To form the FET1 in the upper nanosheets of FET stack 402, a patterned hardmask 702 is next formed covering FET stack 404 and FET stack 406. See FIG. 7. As shown in FIG. 7, this enables the sacrificial gate 330 and sacrificial SiGe nanosheets 306a, 310a, 314a, 318a, 322a, 326a, etc., to be selectively removed from FET stack 402. By way of example only, a poly-silicon or amorphous silicon-selective etch can be used to remove sacrificial gate 330, and an etchant such as NH$_4$OH, TEAH and/or TMAH can be used to selectively etch the sacrificial SiGe nanosheets in FET stack 402.

Removal of the sacrificial gate 330 and sacrificial SiGe nanosheets 306a, 310a, 314a, 318a, 322a, 326a, etc., forms cavities 704 in the FET stack 402 in between the channel Si nanosheets 308a, 312a, 316a, 320a, 324a, 328a, etc. The cavities 704 in the lower nanosheets of FET stack 402 are then filled with a dielectric material. To do so, cavities 704 are first filled with a dielectric material 802 (e.g., SiOx and/or SiN) which is then etched back to a level below the isolation spacer 504. As a result, dielectric material 802 isolates the lower nanosheets of FET stack 402 (i.e., dielectric material 802 wraps around/surrounds the (lower) channel Si nanosheets 308a, 312a, and 316a of FET stack 402) to ensure that this part will not turn on.

A (first) metal gate is then formed in the cavities 704 of the upper portion of FET stack 402 which surrounds at least a portion of each of the channel Si nanosheets 320a, 324a, 328a, etc. in a gate-all-around (GAA) configuration. This metal gate is also referred to herein as a 'replacement' gate since it replaces sacrificial gate 330 that has been removed. To form the replacement metal gate, a gate dielectric 902 is first deposited into and lining the cavities, followed by a gate conductor. See FIG. 9. According to an exemplary embodiment, gate dielectric 902 is a high-κ dielectric. The term "high-κ" as used herein refers to a material having a relative dielectric constant κ which is much higher than that of silicon dioxide (e.g., a dielectric constant κ=25 for hafnium oxide (HfO$_2$) rather than 4 for SiO$_2$). Suitable high-κ gate dielectrics include, but are not limited to, hafnium oxide (HfO$_2$), lanthanum oxide (La$_2$O$_3$), zirconium oxide (ZrO$_2$), aluminum oxide (Al$_2$O$_3$), titanium oxide (TiO$_2$), strontium titanium oxide (SrTiO$_3$), lanthanum aluminum oxide (LaAlO$_3$), yttrium oxide (Y$_2$O$_3$), hafnium oxynitride (HfO$_x$N$_y$), zirconium oxynitride (ZrO$_x$N$_y$), lanthanum oxynitride (La$_2$O$_x$N$_y$), aluminum oxynitride (Al$_2$O$_x$N$_y$), titanium oxynitride (TiO$_x$N$_y$), strontium titanium oxynitride (SrTiO$_x$N$_y$), lanthanum aluminum oxynitride (LaAlO$_x$N$_y$), yttrium oxynitride (Y$_2$O$_x$N$_y$) and/or silicon oxynitride (SiON).

Prior to depositing the gate dielectric 902, an interfacial oxide (not shown) can first be formed on exposed surfaces of the channel Si nanosheets 308a, 312a, 316a, 320a, 324a, 328a, etc. by an oxidation process to a thickness of from about 0.3 nanometers (nm) to about 5 nm, and ranges therebetween, e.g., about 1 nm. According to an exemplary embodiment, the interfacial oxide includes SiOx which may include other chemical elements in it such as nitrogen, germanium, etc.

A gate conductor 904 and a low-resistivity metal 905 are then deposited onto the gate dielectric 902, filling cavities 704 of the upper nanosheets of FET stack 402. See FIG. 9. According to an exemplary embodiment, the gate conductor 904 includes a workfunction setting metal or combination of metals. The particular workfunction metal employed can vary depending on whether an n-type or p-type transistor is desired. Suitable n-type workfunction setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction setting metals include, but are not limited to, TiN, TaN and/or tungsten (W). TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above. Suitable low-resistivity metals include, but are not limited to, aluminum (Al), copper (Cu) and/or tungsten (W).

After formation of the replacement metal gate in the upper nanosheets of FET stack 402, patterned hardmask 702 is removed from FET stack 404 and FET stack 406. Formation of the replacement metal gate in the upper nanosheets of FET stack 402 completes the first FET (FET1) of the present 4T2R unit cell.

Figure 10:
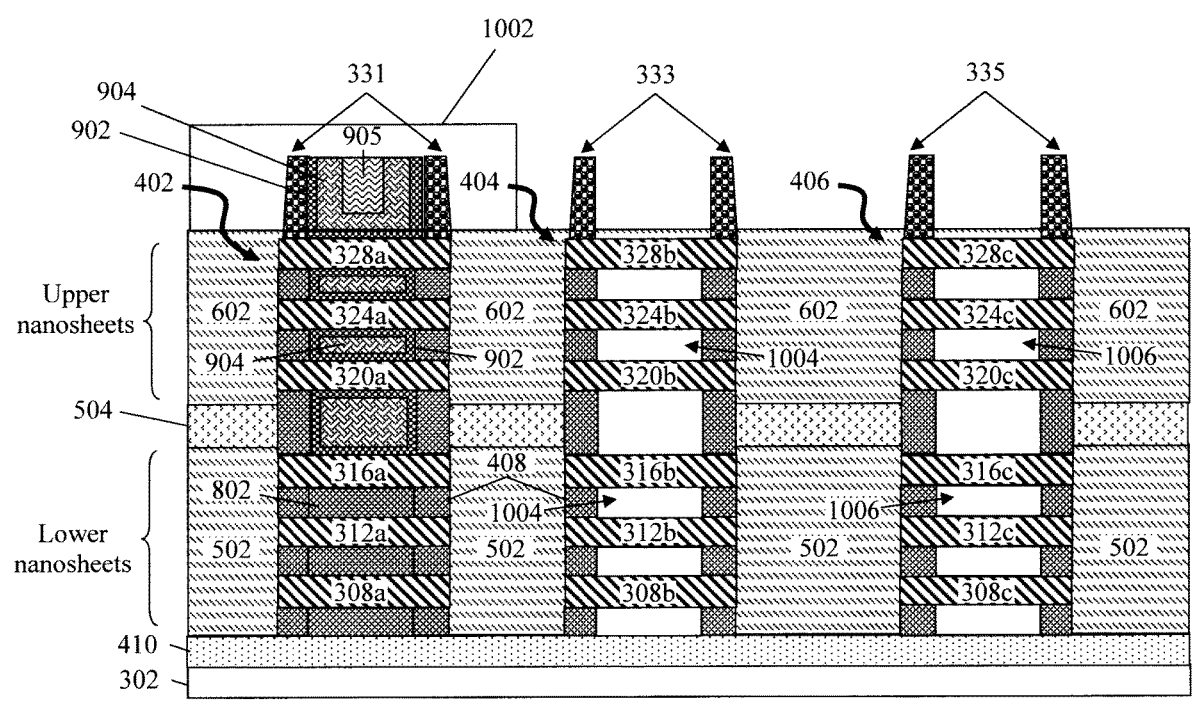
FIG. 10 is a cross-sectional diagram illustrating a patterned hardmask having been formed covering the (left) FET stack, and the sacrificial gate/sacrificial nanosheets having been selectively removed from the (middle) FET stack and (right) FET stack according to an embodiment of the present invention.
Figure 11:
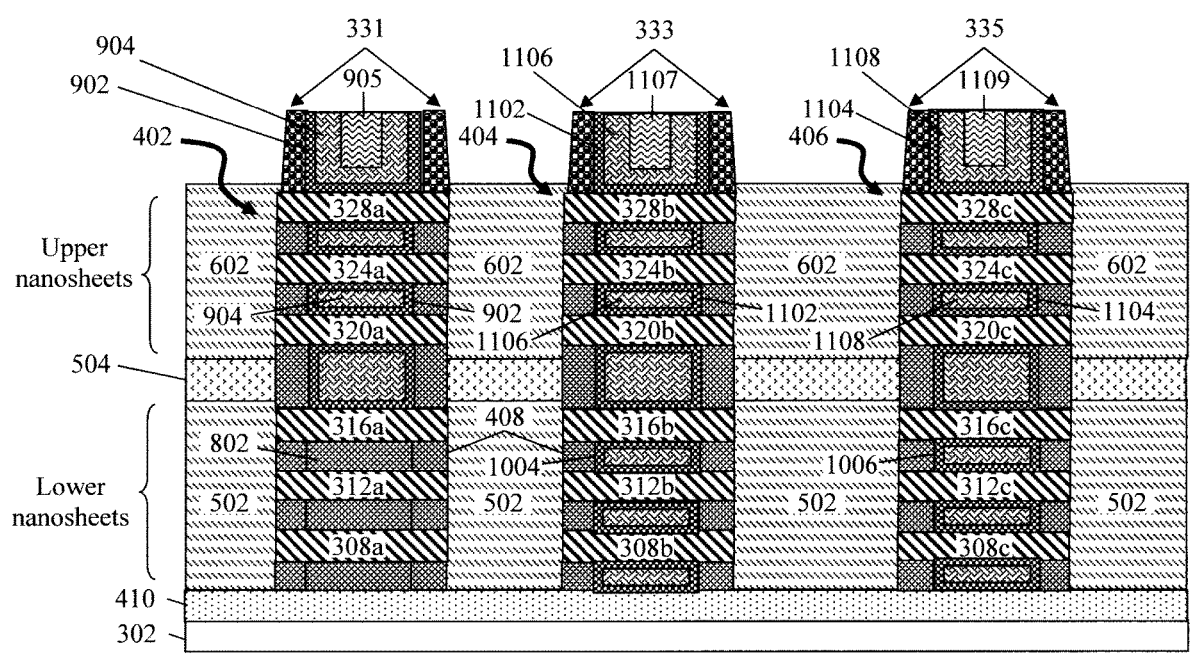
FIG. 11 is a cross-sectional diagram illustrating (second/third) replacement metal gates having been formed in the cavities in the (middle) FET stack (forming FET2 and FET3) and in the (right) FET stack according to an embodiment of the present invention.

A patterned hardmask 1002 is next formed covering FET stack 402. See FIG. 10. As shown in FIG. 10, this enables the sacrificial gate 332 and sacrificial SiGe nanosheets 306$b$, 310$b$, 314$b$, 318$b$, 322$b$, 326$b$, etc., to be selectively removed from FET stack 404, and the sacrificial gate 334 and sacrificial SiGe nanosheets 306$c$, 310$c$, 314$c$, 318$c$, 322$c$, 326$c$, etc., to be selectively removed from FET stack 406. As provided above, a poly-silicon or amorphous silicon-selective etch can be used to remove sacrificial gates 332/334, and an etchant such as NH$_4$OH, TEAH and/or TMAH can be used to selectively etch the sacrificial SiGe nanosheets in FET stacks 404 and 406. Removal of the sacrificial gate 332 and sacrificial SiGe nanosheets 306$b$, 310$b$, 314$b$, 318$b$, 322$b$, 326$b$, etc., forms cavities 1004 in the FET stack 404 in between the channel Si nanosheets 308$b$, 312$b$, 316$b$, 320$b$, 324$b$, 328$b$, etc., and removal of the sacrificial gate 334 and sacrificial SiGe nanosheets 306$c$, 310$c$, 314$c$, 318$c$, 322$c$, 326$c$, etc., forms cavities 1006 in the FET stack 406 in between the channel Si nanosheets 308$c$, 312$c$, 316$c$, 320$c$, 324$c$, 328$c$, etc. For clarity, the terms 'first' and 'second' may also be used herein when referring to cavities 1004 and 1006, respectively.

Replacement metal gates are then formed a) in the cavities 1004 of the upper and lower nanosheets of FET stack 404 b) in the cavities 1006 of the upper and lower nanosheets of FET stack 406. As will be described in detail below, the replacement metal gate formed in the cavities 1004 of the upper nanosheets of FET stack 404 (i.e., a second metal gate of the unit cell) surrounds at least a portion of each of the channel Si nanosheets 320$b$, 324$b$, 328$b$, etc. in a GAA configuration. The replacement metal gate formed in the cavities 1004 of the lower nanosheets of FET stack 404 (i.e., a third metal gate of the unit cell) surrounds at least a portion of each of the channel Si nanosheets 308$b$, 312$b$, 316$b$, etc. in a GAA configuration. The replacement metal gate formed in the cavities 1006 of the lower nanosheets of FET stack 406 (i.e., a fourth metal gate of the unit cell) surrounds at least a portion of each of the channel Si nanosheets 308$c$, 312$c$, 316$c$, etc. in a GAA configuration. The replacement metal gate formed in the cavities 1006 of the upper nanosheets of FET stack 406 is a sacrificial gate, since it, along with channel Si nanosheets 320$c$, 324$c$, 328$c$, etc., will be removed and replaced with a low resistance metal. See below.

To form the replacement metal gates, a gate dielectric is first deposited into and lining cavities 1004 and 1006, followed by a gate conductor. The gate dielectric deposited into/lining cavities 1004 is given reference numeral 1102 and the gate dielectric deposited into/lining cavities 1006 is given reference numeral 1104. See FIG. 11. However, this is done merely for clarity of description, since gate dielectric 1102 and 1104 are preferably the same material and are formed in FET stacks 404 and 406 concurrently. According to an exemplary embodiment, gate dielectrics 1102 and 1104 are a high-κ dielectric. As provided above, suitable high-κ gate dielectrics include, but are not limited to, HfO$_2$, La$_2$O$_3$, ZrO$_2$, Al$_2$O$_3$, TiO$_2$, SrTiO$_3$, LaAlO$_3$, Y$_2$O$_3$, HfO$_x$N$_y$, ZrO$_x$N$_y$, La$_2$O$_x$N$_y$, Al$_2$O$_x$N$_y$, TiO$_x$N$_y$, SrTiO$_x$N$_y$, LaAlO$_x$N$_y$, Y$_2$O$_x$N$_y$, and/or SiON.

Prior to depositing the gate dielectrics 1102 and 1104, an interfacial oxide (not shown) can first be formed on exposed surfaces of the channel Si nanosheets 308$b,c$, 312$b,c$, 316$b$, $c$, 320$b,c$, 324$b,c$, 328$b,c$, etc. by an oxidation process to a thickness of from about 0.3 nm to about 5 nm, and ranges therebetween, e.g., about 1 nm. According to an exemplary embodiment, the interfacial oxide includes SiOx which may include other chemical elements in it such as nitrogen, germanium, etc.

Gate conductors 1106 and 1108, and low-resistivity metal 1107 and 1109 are then deposited onto the gate dielectrics 1102 and 1104, filling cavities 1004 of the upper and lower nanosheets of FET stack 404 and cavities 1006 of the upper and lower nanosheets of FET stack 406, respectively. As above, the gate conductor deposited into cavities 1004 is given a different reference numeral from the gate conductor deposited into cavities 1006 merely for clarity of description, since gate conductors 1106 and 1108 are preferably the same material(s) and are formed in FET stacks 404 and 406 concurrently. According to an exemplary embodiment, the gate conductors 1106 and 1108 include a workfunction setting metal or combination of metals. As provided above, suitable n-type workfunction setting metals include, but are not limited to, TiN, TaN and/or Al-containing alloys such as TiAl, TiAlN, TiAlC, TaAl, TaAlN and/or TaAlC. Suitable p-type workfunction setting metals include, but are not limited to, TiN, TaN and/or W. Suitable low-resistivity metals include, but are not limited to, Al, Cu and/or W.

After formation of the replacement metal gate in i) the cavities 1004 of the upper and lower nanosheets of FET stack 404 and ii) in the cavities 1006 of the upper and lower nanosheets of FET stack 406, patterned hardmask 1002 is removed from FET stack 402. Formation of the replacement metal gate in the upper and lower nanosheets of FET stack 404 completes the second FET (FET2) and third FET (FET3) of the present 4T2R unit cell. As provided above, FET2 and FET3 are isolated with a shared metal gate.

Figure 12:
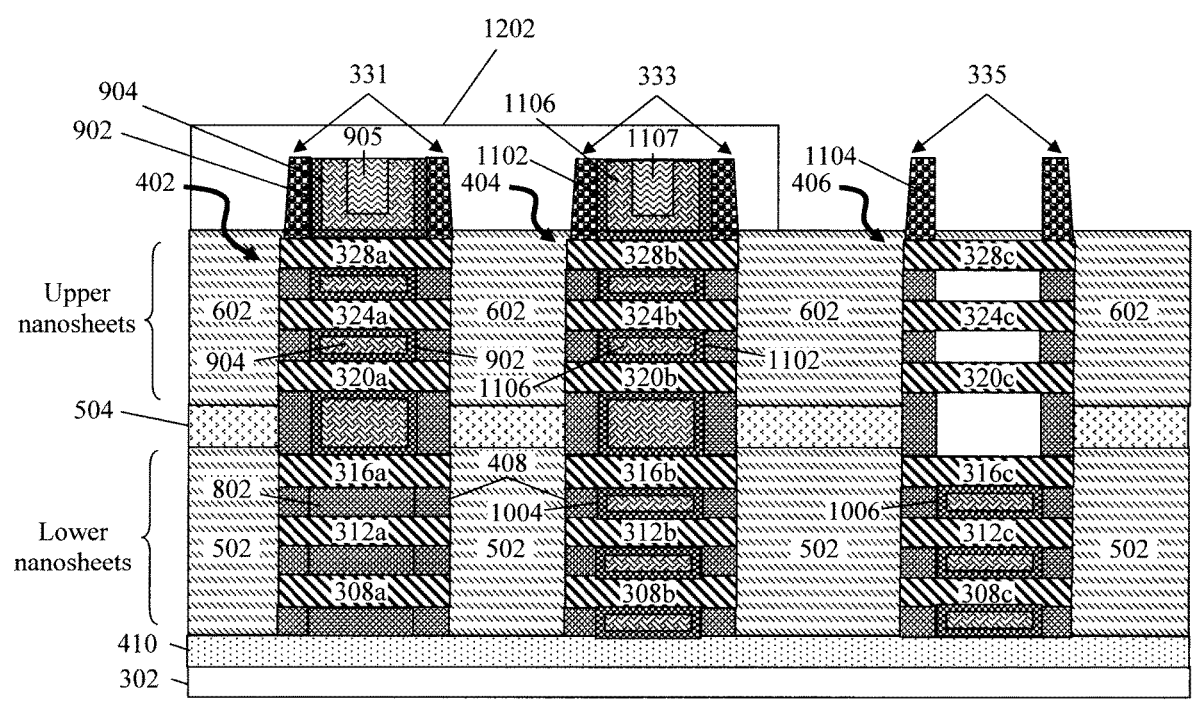
FIG. 12 is a cross-sectional diagram illustrating a patterned hardmask having been formed covering the (left) FET stack and in the (middle) FET stack, and the replacement metal gates in the (right) FET stack having been recessed to a level below the isolation spacer to forming a FET4 according to an embodiment of the present invention.
Figure 13:
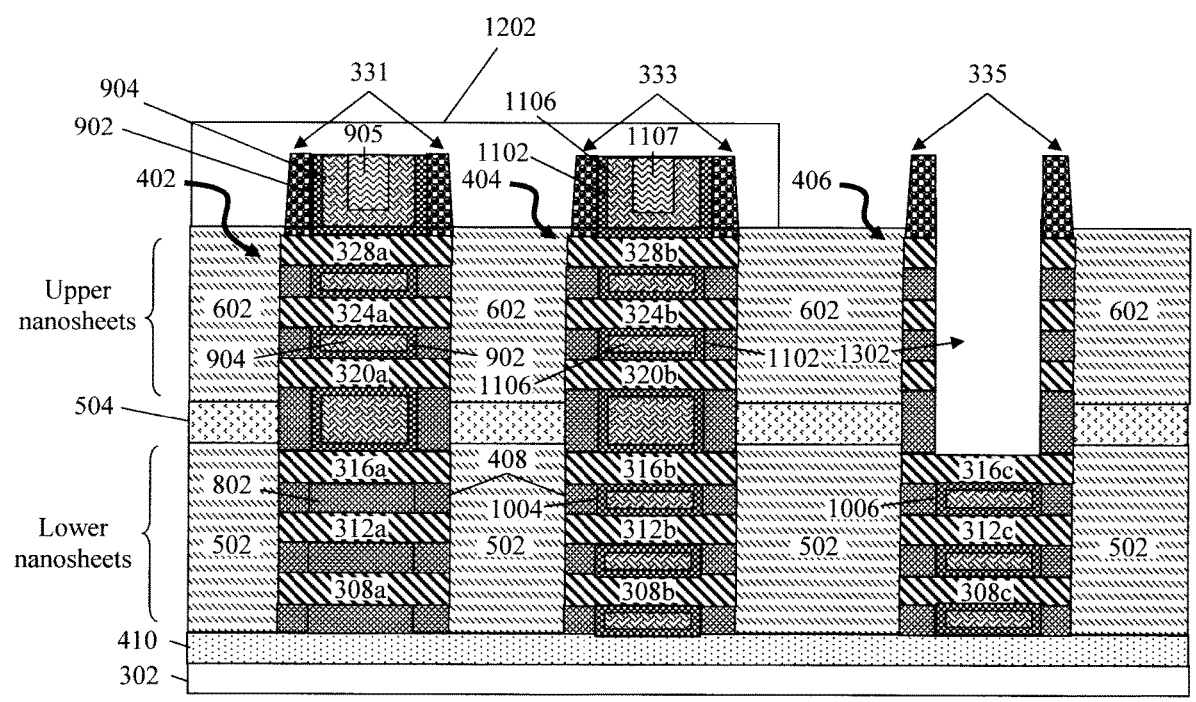
FIG. 13 is a cross-sectional diagram illustrating the (upper) channel nanosheets of the (right) FET stack having been removed forming a cavity in the upper nanosheets of the (right) FET stack according to an embodiment of the present invention.

A patterned hardmask 1202 is next formed covering FET stack 402 and FET stack 404. See FIG. 12. As shown in FIG. 12, this enables the replacement metal gates (i.e., gate dielectric 1104 and gate conductor 1108) in FET stack 406 to be recessed to a level below the isolation spacer 504, thereby removing the sacrificial replacement metal gate formed in the cavities 1006 of the upper nanosheets of FET stack 406. As a result, the replacement metal gate (i.e., gate dielectric 1104 and gate conductor 1108) is now present in only the lower nanosheets of FET stack 406, completing the fourth FET (FET4) of the present 4T2R unit cell. According to an exemplary embodiment, the replacement metal gates (i.e., gate dielectric 1104 and gate conductor 1108) of FET stack 406 are recessed by reactive ion etching (RIE) or wet etching (e.g. SC1, DHF, and combination thereof).

Figure 14:
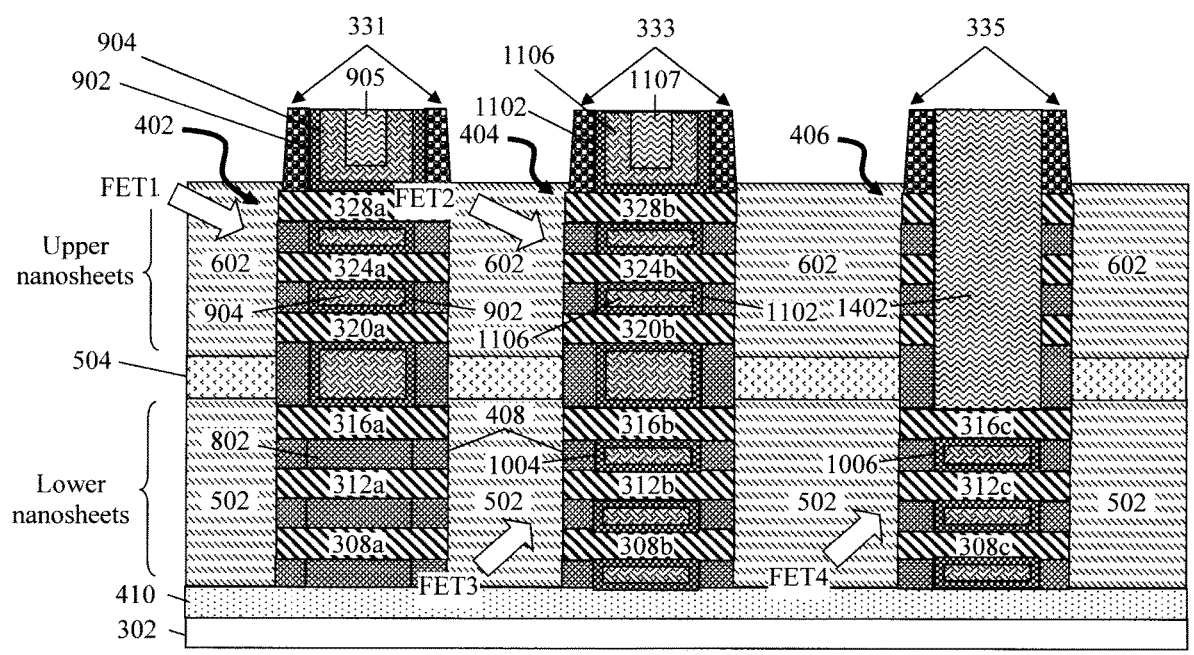
FIG. 14 is a cross-sectional diagram illustrating the cavity in the upper nanosheets of the (right) FET stack having been filled with a low-resistivity metal according to an embodiment of the present invention.
Figure 15:
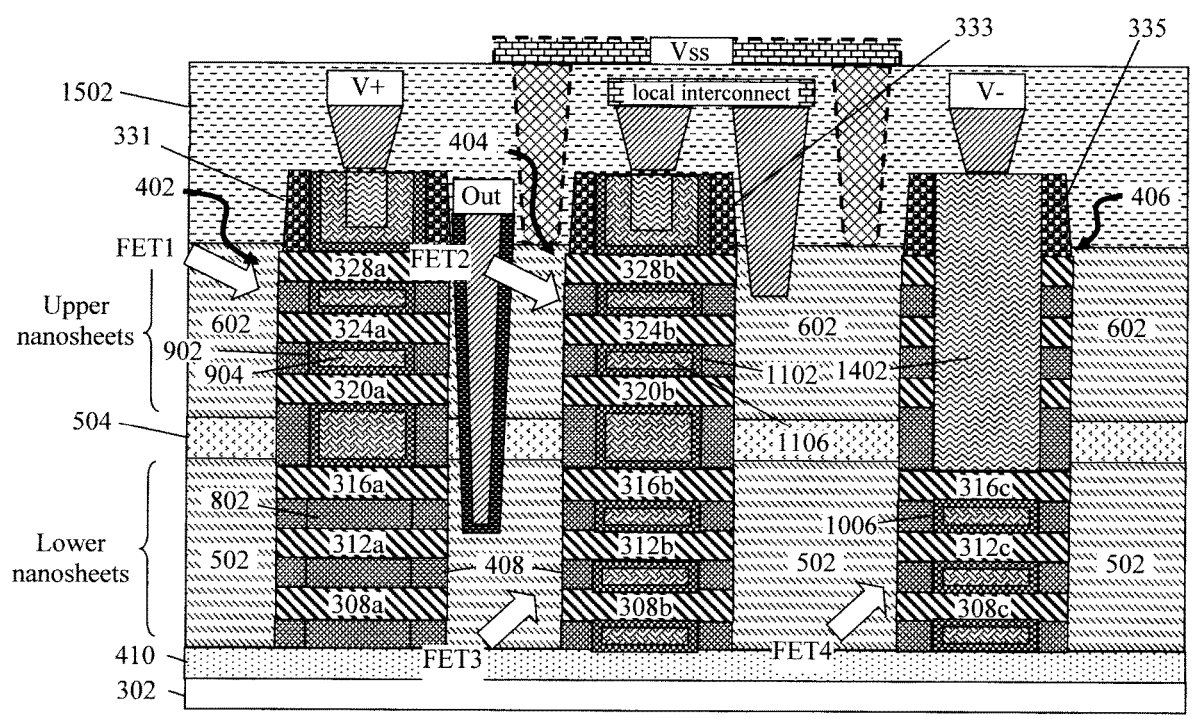
FIG. 15 is a cross-sectional diagram illustrating a (first) dielectric having been deposited over the FET1, FET2, FET3 and FET4, and gate/source and drain contacts having been formed in the (first) dielectric according to an embodiment of the present invention.
Figure 16:
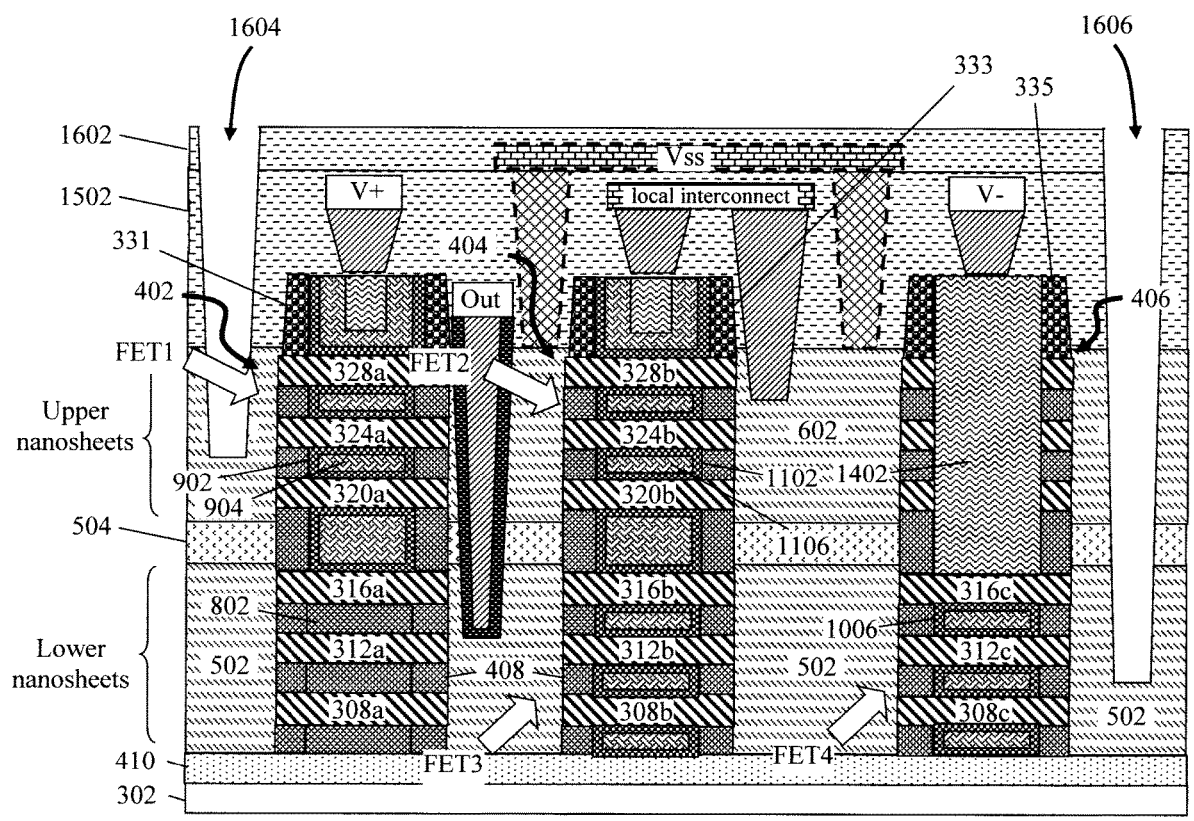
FIG. 16 is a cross-sectional diagram illustrating a (second) dielectric having been deposited onto the (first) dielectric over the gate/source and drain contacts, a first via having been patterned that extends through the (first/second) dielectrics down to the source and drains of the FET1, and a second via having been patterned that extends through the (first/second) dielectrics down to the source and drains of the FET4 according to an embodiment of the present invention.
Figure 17:
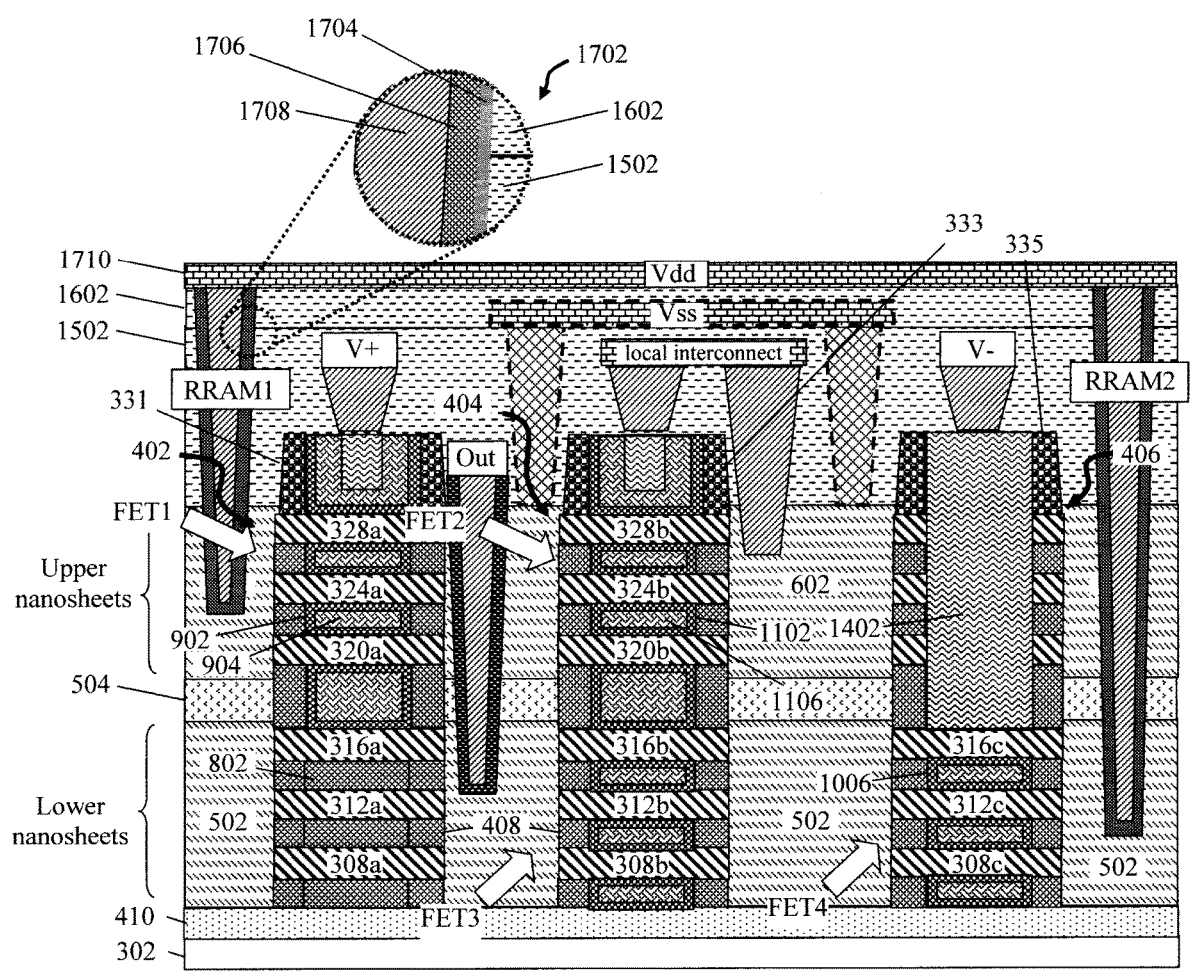
FIG. 17 is a cross-sectional diagram illustrating an RRAM1 and an RRAM2 having been formed in the first via and the second via according to an embodiment of the present invention.

Recessing the replacement metal gates of FET stack 406 exposes the (upper) channel Si nanosheets 320c, 324c, 328c, etc. of FET stack 406, which are then removed. See FIG. 13. According to an exemplary embodiment, the (upper) channel Si nanosheets 320c, 324c, 328c, etc. of FET stack 406 are removed using a directional (anisotropic) etching process such as a Si-selective RIE, forming a cavity 1302 in the upper nanosheets of FET stack 406. Cavity 1302 is then filled with a low-resistivity metal 1402. See FIG. 14. Suitable low-resistivity metals include, but are not limited to, aluminum (Al), copper (Cu) and/or tungsten (W). The patterned hardmask 1202 is removed from FET stack 402 and FET stack 404. As shown in FIG. 14, by way of the present process FET1 is now formed in the upper nanosheets of FET stack 402, FET2 is formed in the upper nanosheets of FET stack 404 and shares common gate with FET3 which is formed in the lower nanosheets of FET stack 404, and FET4 is formed in the lower nanosheets of FET stack 406.

A dielectric 1502 is then deposited over FET1, FET2, FET3 and FET4. See FIG. 15. Suitable dielectrics 1502 include, but are not limited to, oxide materials such as SiOx and/or organosilicate glass (SiCOH) and/or ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH). Standard metallization techniques are then employed to form V+ and V− gate contacts to FET1 and FET4, respectively, to form a local interconnect between the gate/source and drain of FET2, to form Vss interconnect between the source and drains of FET1 and FET2, and to form an (out) contact to the source and drains of FET3 in dielectric 1502.

As provided above, the RRAM devices of the present 4T2R unit cell are formed in contact vias to the source and drains of FET1 and FET4. To do so, a dielectric 1602 (e.g., SiOx, SiCOH and/or ULK-ILD materials such as pSiCOH) is deposited onto dielectric 1502 over the gate/source and drain contacts. See FIG. 16. Lithography and etching techniques are then employed to pattern a first via 1604 extending through dielectrics 1502 and 1602 down to the source and drains of FET1, and a second via 1606 extending through dielectrics 1502 and 1602 down to the source and drains of FET4.

An RRAM1 and an RRAM2 are then formed in first via 1604 and second via 1606, respectively. See FIG. 17. As shown in magnified view 1702 in FIG. 17, RRAM1 and RRAM2 are formed by first depositing a switching dielectric layer 1704 into and lining first via 1604 and second via 1606. According to an exemplary embodiment, switching dielectric layer 1704 is formed from a metal oxide material. Suitable metal oxide materials include, but are not limited to, $HfO_2$, tantalum oxide ($Ta_2O_5$), $TiO_2$, tungsten oxide ($WO_3$), $ZrO_2$, $Al_2O_3$, and/or $SrTiO_3$.

An electrode layer 1706 is then deposited into first via 1604 and second via 1606 over switching dielectric layer 1704. According to an exemplary embodiment, electrode layer 1706 is formed from a metal-containing compound. Suitable metal-containing compounds include, but are not limited to, TiN and/or TaN. A fill metal 1708 is then deposited into first via 1604 and second via 1606 over electrode layer 1706. Suitable fill metals include, but are not limited to, W, Cu, aluminum (Al), cobalt (Co), and/or TiN. Standard metallization techniques are then used to form a Vdd interconnect 1710 between RRAM1 and RRAM2.

Figure 18:
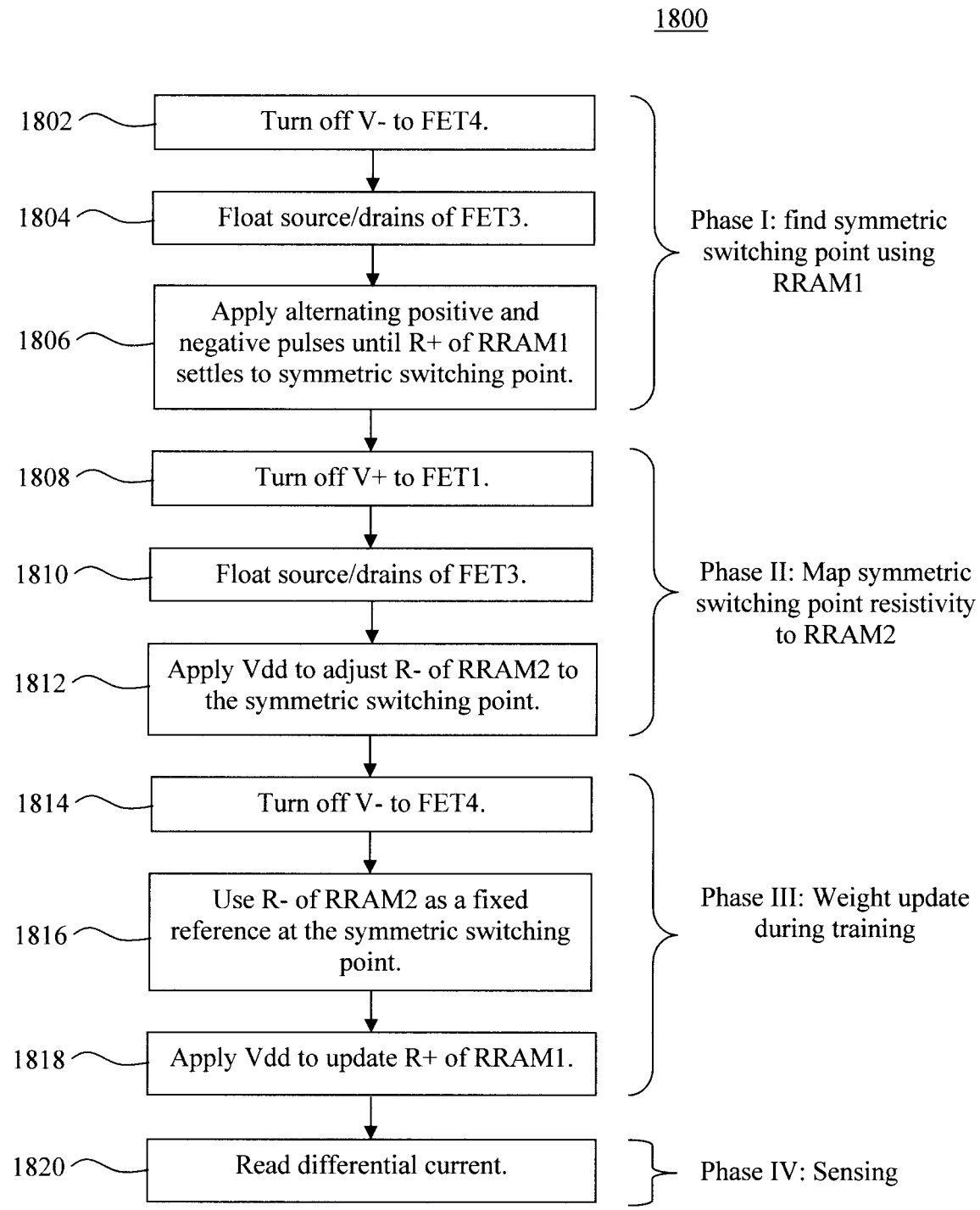
FIG. 18 is a cross-sectional diagram illustrating an exemplary methodology for operating the present stacked nanosheet 4T2R unit cell for neuromorphic computing according to an embodiment of the present invention.

FIG. 18 is a diagram illustrating an exemplary methodology 1800 for operating the present stacked nanosheet 4T2R unit cell for neuromorphic computing. For illustrative purposes only, methodology 1800 will be described in conjunction with the present 4T2R unit cell design shown in FIG. 17. In a first phase (Phase I) of methodology 1800, RRAM1 is used to find a symmetric switching point. To do so, a gate voltage (V−) to FET4 is turned off (step 1802), the source and drains of FET3 are permitted to float (step 1804), and alternating positive and negative pulses are applied to Vdd interconnect 1710 until the resistance R+ of RRAM1 settles to the symmetric switching point (step 1806).

In a second phase (Phase II) of methodology 1800, the symmetric switching point resistivity is mapped to RRAM2. To do so, a gate voltage (V+) to FET1 is turned off (step 1808), the source and drains of FET3 are permitted to float (step 1810), and Vdd is applied to adjust the resistance R− of RRAM2 to the symmetric switching point (step 1812).

In a third phase (Phase III) of methodology 1800, a weight update is performed during training. To do so, a gate voltage (V−) to FET4 is turned off (step 1814), the resistance R− of RRAM2 is used as a fixed reference at the symmetric switching point (step 1816), and Vdd is applied to update the resistance R+ of RRAM1 (step 1818).

In a fourth phase (Phase IV) of methodology 1800, sensing is performed. To do so, a differential current is read via the contact to the source and drains of FET3 (step 1820).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a four field-effect transistor (FET) two resistive random access memory (RRAM) unit cell, the method comprising the steps of:
  forming nanosheets on a substrate comprising alternating sacrificial and channel nanosheets;
  patterning the nanosheets into FET stacks such that each of the FET stacks has portions of the sacrificial and channel nanosheets, wherein the FET stacks comprise at least a first FET stack, a second FET stack and a third FET stack;
  forming lower source and drains on opposite sides of the channel nanosheets in a lower portion of the FET stacks;
  forming upper source and drains on opposite sides of the channel nanosheets in an upper portion of the FET stacks, wherein the upper source and drains are separated from the lower source and drains by an isolation spacer;
  selectively removing the sacrificial nanosheets from the first FET stack;
  forming i) a first gate of a first FET (FET1) that surrounds at least a portion of the channel nanosheets in the upper portion of the first FET stack;
  selectively removing the sacrificial nanosheets from the second FET stack and the third FET stack;
  forming ii) a second gate of a second FET (FET2) that surrounds at least a portion of the channel nanosheets in the upper portion of the second FET stack, iii) a third gate of a third FET (FET3) that surrounds at least a portion of the channel nanosheets in the lower portion of the second FET stack, and iv) a fourth gate of a fourth FET (FET4) that surrounds at least a portion of the channel nanosheets in the lower portion of the third FET stack; and forming RRAM devices in contact vias to the source and drains of the FET1 and the FET4.

2. The method of claim 1, wherein the sacrificial nanosheets comprise silicon germanium (SiGe), and wherein the channel nanosheets comprise silicon (Si).

3. The method of claim 1, wherein selective removal of the sacrificial nanosheets from the first FET stack forms cavities in the first FET stack, the method further comprising the steps of:

filling the cavities in the first FET stack with a dielectric material; and recessing the dielectric material in the cavities to a level below the isolation spacer to permit the forming of the first gate of the FET1 in the upper portion of the first FET stack.

4. The method of claim 1, further comprising the steps of:

forming a sacrificial gate that surrounds at least a portion of the channel nanosheets in the upper portion of the third FET stack;

removing the sacrificial gate;

removing the channel nanosheets in the upper portion of the third FET stack to form a cavity in the upper portion of the third FET stack; and filling the cavity with a low-resistivity metal.

5. The method of claim 1, wherein the low-resistivity metal is selected from the group consisting of: aluminum (Al), copper (Cu), tungsten (W), and combinations thereof.

6. The method of claim 1, wherein the step of forming the RRAM devices in the contact vias to the source and drains of the FET1 and the FET4 comprises the steps of:

depositing at least one dielectric over the FET1, the FET2, the FET3 and the FET4;

patterning a first via that extends through the at least one dielectric down to the source and drains of the FET1;

patterning a second via that extends through the at least one dielectric down to the source and drains of the FET4;

depositing a switching dielectric layer into and lining the first via and the second via;

depositing an electrode layer into the first via and the second via over the switching dielectric layer; and depositing a fill metal into the first via and the second via over the electrode layer.

7. The method of claim 6, wherein the switching dielectric layer comprises a metal oxide material selected from the group consisting of: hafnium oxide ($HfO_2$), tantalum oxide ($Ta_2O_5$), titanium oxide ($TiO_2$), tungsten oxide ($WO_3$), zirconium oxide ($ZrO_2$), aluminum oxide ($Al_2O_3$), strontium titanium oxide ($SrTiO_3$), and combinations thereof.

8. The method of claim 6, wherein the electrode layer comprises a compound selected from the group consisting of: titanium nitride (TiN), tantalum nitride (TaN), and combinations thereof.

9. The method of claim 6, wherein the fill metal is selected from the group consisting of: tungsten (W), copper (Cu), aluminum (Al), cobalt (Co), TiN, and combinations thereof.

10. The method of claim 1, further comprising the steps of:

forming a gate contact to the FET1;

forming a gate contact to the FET4;

forming an interconnect between the second gate and the source and drain of the FET2;

forming an interconnect between the source and drain of the FET1 and the FET2; and forming a source and drain contact to the FET3.

11. A four FET two RRAM unit cell, comprising:

FET stacks of channel nanosheets disposed on a substrate, the FET stacks comprising at least a first FET stack, a second FET stack and a third FET stack;

lower source and drains formed on opposite sides of the channel nanosheets in a lower portion of the FET stacks;

upper source and drains formed on opposite sides of the channel nanosheets in an upper portion of the FET stacks, wherein the upper source and drains are separated from the lower source and drains by an isolation spacer;

a first gate of a first FET (FET1) that surrounds at least a portion of the channel nanosheets in the upper portion of the first FET stack;

a second gate of a second FET (FET2) that surrounds at least a portion of the channel nanosheets in the upper portion of the second FET stack;

a third gate of a third FET (FET3) that surrounds at least a portion of the channel nanosheets in the lower portion of the second FET stack;

a fourth gate of a fourth FET (FET4) that surrounds at least a portion of the channel nanosheets in the lower portion of the third FET stack; and RRAM devices formed in contact vias to the source and drains of the FET1 and the FET4.

12. The four FET two RRAM unit cell of claim 11, wherein the channel nanosheets comprise Si.

13. The four FET two RRAM unit cell of claim 11, further comprising:

a dielectric material surrounding the channel nanosheets in the lower portion of the first FET stack.

14. The four FET two RRAM unit cell of claim 11, further comprising:

a cavity in the upper portion of the third FET stack; and a low-resistivity metal in the cavity.

15. The four FET two RRAM unit cell of claim 14, wherein the low-resistivity metal is selected from the group consisting of: Al, Cu, W, and combinations thereof.

16. The four FET two RRAM unit cell of claim 14, further comprising:

at least one dielectric disposed on the FET1, the FET2, the FET3 and the FET4.

17. The four FET two RRAM unit cell of claim 16, wherein RRAM devices comprise:

a first via that extends through the at least one dielectric down to the source and drains of the FET1;

a second via that extends through the at least one dielectric down to the source and drains of the FET4;

a switching dielectric layer lining the first via and the second via, wherein the switching dielectric layer comprises a metal oxide material selected from the group consisting of: $HfO_2$, $Ta_2O_5$, $TiO_2$, $WO_3$, $ZrO_2$, $Al_2O_3$, $SrTiO_3$, and combinations thereof;

an electrode layer via disposed on the switching dielectric layer in the first via and the second via, wherein the electrode layer comprises a compound selected from the group consisting of: TiN, TaN, and combinations thereof; and a fill metal disposed on the electrode layer in the first via and the second via, wherein the fill metal is selected from the group consisting of: W, Cu, Al, Co, TiN, and combinations thereof.

18. The four FET two RRAM unit cell of claim 11, further comprising:
- a gate contact to the FET1;
- a gate contact to the FET4;
- an interconnect between the second gate and the source and drain of the FET2;
- an interconnect between the source and drain of the FET1 and the FET2; and
- a source and drain contact to the FET3.

19. A method for neuromorphic computing, the method comprising the steps of:
- providing a four FET two RRAM unit cell, comprising:
  - FET stacks of channel nanosheets disposed on a substrate, the FET stacks comprising at least a first FET stack, a second FET stack and a third FET stack;
  - lower source and drains formed on opposite sides of the channel nanosheets in a lower portion of the FET stacks;
  - upper source and drains formed on opposite sides of the channel nanosheets in an upper portion of the FET stacks, wherein the upper source and drains are separated from the lower source and drains by an isolation spacer;
  - a first gate of a first FET (FET1) that surrounds at least a portion of the channel nanosheets in the upper portion of the first FET stack;
  - a second gate of a second FET (FET2) that surrounds at least a portion of the channel nanosheets in the upper portion of the second FET stack;
  - a third gate of a third FET (FET3) that surrounds at least a portion of the channel nanosheets in the lower portion of the second FET stack;
  - a fourth gate of a fourth FET (FET4) that surrounds at least a portion of the channel nanosheets in the lower portion of the third FET stack;
  - an RRAM1 formed in a contact via to the source and drains of the FET1, and an RRAM2 formed in a contact via to the source and drains of the FET4;
- applying alternating positive and negative pulses to the RRAM1 until a resistance R+ of RRAM1 settles to a symmetric switching point;
- adjusting a resistance R− of RRAM2 to the symmetric switching point; and
- updating the resistance R+ of RRAM1 using the resistance R− of RRAM2 as a fixed reference at the symmetric switching point.

20. The method of claim 19, further comprising the step of:
- reading a differential current via the source and drain regions of the FET3.

* * * * *